United States Patent [19]
Houser et al.

[11] Patent Number: 6,105,246
[45] Date of Patent: Aug. 22, 2000

[54] METHOD OF MAKING A CIRCUIT BOARD HAVING BURR FREE CASTELLATED PLATED THROUGH HOLES

[75] Inventors: David E. Houser, Apalachin; James M. Larnerd, Binghamton; Jeffrey L. Lee, Vestal; Francis S. Poch, Apalachin, all of N.Y.

[73] Assignee: International Business Machines Corporation, Armonk, N.Y.

[21] Appl. No.: 09/315,428

[22] Filed: May 20, 1999

[51] Int. Cl.[7] .................................................... H01K 3/10
[52] U.S. Cl. ................................. 29/852; 29/846; 29/829; 174/262; 174/266
[58] Field of Search ............................. 29/852, 829, 846; 427/97; 228/180.21; 174/260, 262, 265, 266

[56] References Cited

U.S. PATENT DOCUMENTS

| | | | |
|---|---|---|---|
| 3,357,099 | 12/1967 | Nagy | 29/852 |
| 4,372,046 | 2/1983 | Suzuki | 29/852 |
| 4,543,715 | 10/1985 | Iadarola et al. | 29/852 |
| 4,790,894 | 12/1988 | Homma et al. | 156/250 |
| 5,499,446 | 3/1996 | Murakami | 29/852 |
| 5,499,447 | 3/1996 | Murakami | 29/852 |

FOREIGN PATENT DOCUMENTS

| | | | |
|---|---|---|---|
| 5-267847 | 10/1983 | Japan | 29/852 |
| 4-148591 | 5/1992 | Japan | 29/852 |

*Primary Examiner*—Carl J. Arbes
*Assistant Examiner*—Minh Trinh
*Attorney, Agent, or Firm*—Schmeiser, Olsen & Watts; Lawrence R. Fraley

[57] ABSTRACT

The present invention provides a method of creating a circuit board having burr free castellated plated through holes. In particular, the leading edge of the plated through hole, that tends to produce burr formation using conventional profiling methods, is removed or pre-profiled. The pre-profiled plated through hole is then profiled at a distance slightly off-set from the pre-profiled edge to further prevent burr formation.

8 Claims, 4 Drawing Sheets

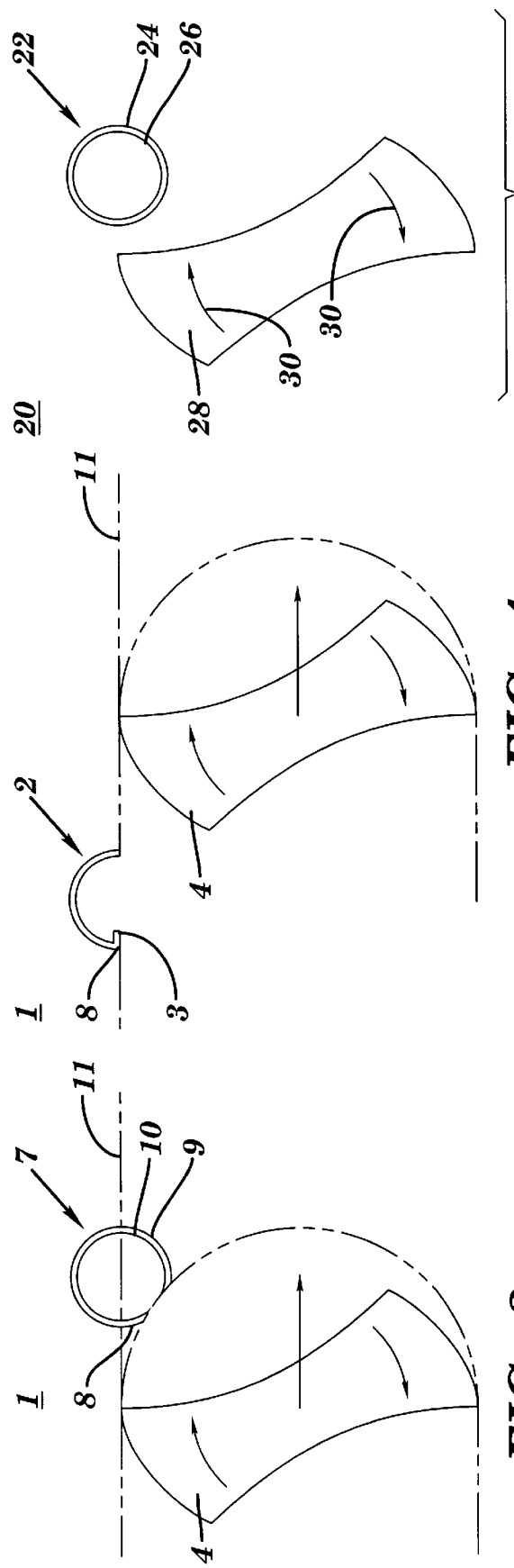

METHOD OF MAKING A CIRCUIT BOARD HAVING BURR FREE CASTELLATED PLATED THROUGH HOLES

BACKGROUND OF THE INVENTION

1. Technical Field

The present invention relates generally to circuit board technology, and more particularly, to a method of manufacturing a circuit board wherein the plated through holes are pre-profiled to prevent burr formation.

2. Related Art

Castellated plated through holes located at the periphery of a substrate or circuit board are commonly used in circuit technology for various applications. For instance, castellated plated through holes may be used when coupling adjacent circuit boards, thereby providing a solder inspection joint to ensure the solder "wicks up" properly at the interface of the two boards.

Various methods are currently used to create castellated plated through holes at the edges of circuit boards. For instance, a castellated plated through hole may be formed by injection molding, or by cutting, milling, drilling, blanking, etc., the edges of the circuit board. However, as illustrated in FIG. 1, conventional methods tend to produce a circuit board 1, wherein protruding burrs 3 are formed in the castellated plated through holes 2.

FIG. 2 illustrates a prior art profiling tool 4, rotating in the direction indicated by arrows 5, approaching a plated through hole 7 within circuit board 1 from a lateral direction indicated by arrow 6. As shown in FIG. 3, burr formation results when profiling tool 4, moving along a path 11, begins to break through a leading edge 8 of inner hole wall 9. "Leading edge" refers to the first surface or edge of plated through hole 7 contacted by profiling tool 4. Once leading edge 8 of plated through hole 7 has been severed, the only forces available to resist profiling tool 4 are the adhesive forces located between inner hole wall 9 and a layer of copper laminate 10 plated thereon. The heat generated as profiling tool 4 completes the pass through plated through hole 7, causes copper laminate 10 to detach and pull away from inner hole wall 9 at leading edge 8. This occurs because the adhesive forces between copper laminate 10 and inner hole wall 9 at leading edge 8 are not sufficient to hold copper laminate 10 in place. FIG. 4 shows the loose flap of copper laminate at leading edge 8 of plated through hole 7 folded over and protruding into the center of castellated plated through hole 2, resulting in what is commonly referred to as a "burr" 3.

The problems associated with burr formation include the potential to dislodge and short circuit the device, interference with inspection of solder joints, contamination of further processing steps, and so on.

Based on the above, there is a need for a new method of creating castellated plated through holes in circuit boards which does not result in burr formation.

SUMMARY OF THE INVENTION

The present invention provides a method of overcoming the above-identified problems of the related art by, in general, pre-profiling the plated through holes, thereby removing the leading edge of the plated through hole wall to prevent burr formation during the subsequent profiling operation.

The first general aspect of the present invention provides a method of producing a circuit board having burr free castellated plated through holes, comprising the steps of: providing the circuit board having at least one plated through hole therein; removing a lengthwise portion of the at least one plated through hole; and profiling the at least one plated through hole, leaving a recessed portion at an edge of the circuit board. This aspect allows for the creation of a circuit board having castellated plated through holes at the periphery, without the burr formation associated with conventional methods.

The second general aspect of the present invention provides for a method of producing a burr free castellated plated through hole, comprising the steps of: providing a circuit board having at least one plated through hole therein; removing a lengthwise section of a vertical wall of the at least one plated through hole; and removing a portion of the at least one plated through hole, leaving a recessed portion within an edge of the circuit board. This aspect allows for similar advantages as those associated with the first aspect.

The third general aspect of the present invention provides for a circuit board having at least one burr free castellated plated through hole formed by removing a first portion of an at least one plated through hole, and removing a second portion of the at least one plated through hole, leaving a recessed portion within an edge of the circuit board. This aspect provides a circuit board which allows for similar advantages as those associated with the first aspect.

It is therefore an advantage of the present invention to provide a method of forming burr free castellated plated through holes in the periphery of a circuit board.

It is therefore a further advantage of the present invention to provide conventional circuit boards having castellated plated through holes which have unobstructed inspection joints and provide a reduced risk of shorts.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein:

FIG. 3 depicts a prior art profiling tool cutting the leading edge of plated through hole in accordance with conventional methods;

FIG. 4 depicts a prior art castellated plated through hole exhibiting burr formation in accordance with conventional methods;

FIG. 5 depicts a cutting tool placed above a plated through hole in accordance with the present invention;

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment.

FIG. 5 depicts a portion of a circuit board 20, having a plated through hole 22 formed therein. It should be understood that only one plated through hole 22 is shown in circuit board 20 to simplify the description of the present invention. Plated through hole 22 includes inner hole wall 24 and conductive laminate 26. Plated through hole 22 is typically formed in circuit board 20 via drilling, end milling, etc., then plated with a conductive laminate 26, typically copper, or other suitable material, using conventional plating methods.

Figure 1:
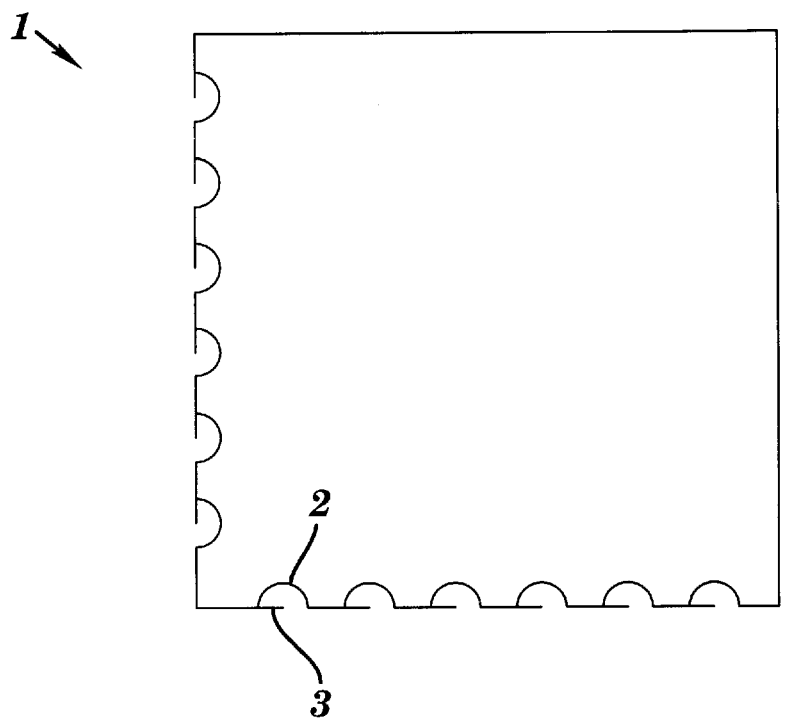
FIG. 1 depicts a portion of a prior art circuit board having burrs protruding into the castellated plated through holes.
Figure 2:
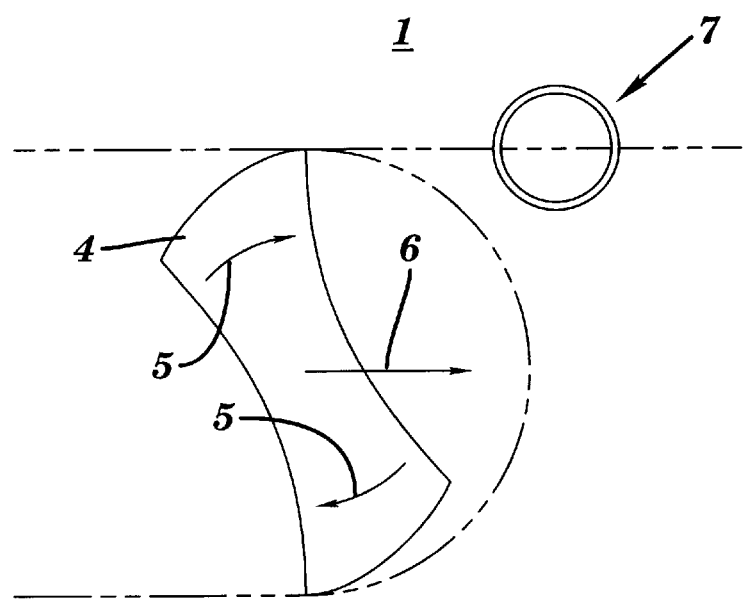
FIG. 2 depicts a prior art profiling tool approaching a plated through hole in accordance with conventional methods.
Figure 6:
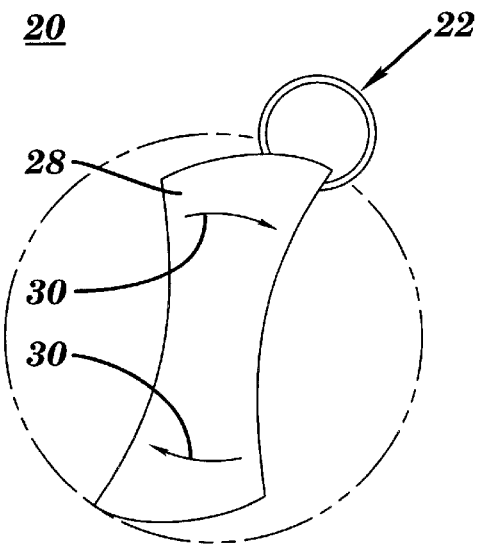
FIG. 6 depicts a pre-profiling operation in accordance with the present invention.
Figure 7:
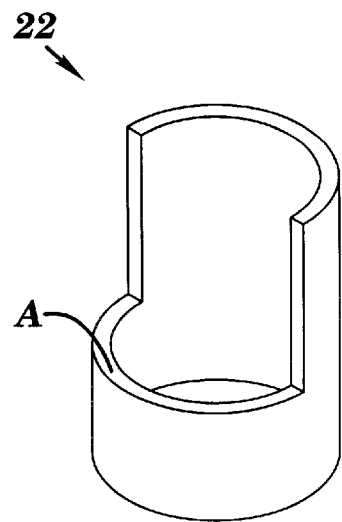
FIG. 7 depicts an isometric view of a plated through hole partially cut to illustrate the direction of pre-profiling in accordance with the present invention.

Cutting tool 28, such as a milling cutter, drill, or other similar tool, rotating in the direction indicated by arrows 30, is positioned vertically over plated through hole 22. As illustrated in FIG. 6, cutting tool 28 is plunged into plated through hole 22. Cutting tool 28 enters plated through hole 22 from a first side of circuit board 20 and exits from the opposite side of circuit board 20. In other words, cutting tool 28 plunges all the way through the thickness of circuit board 20, removing a section of plated through hole along the length of the plated through hole 22. FIG. 7 more clearly illustrates the direction of plunging. In particular, cutting tool 28 is plunged into surface A of plated through hole 22.

Figure 9:
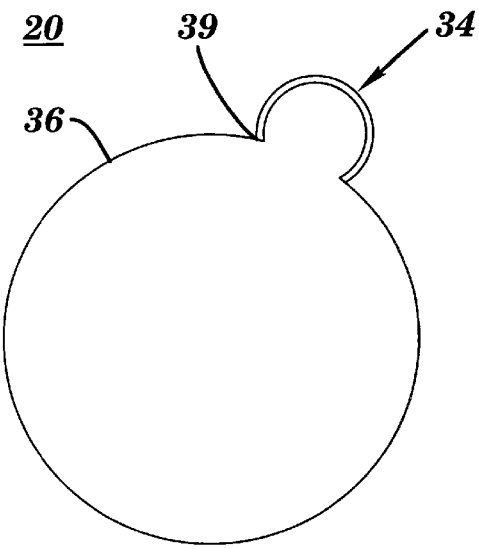
FIG. 9 depicts a pre-profiled plated through hole in accordance with the present invention.
Figure 8:
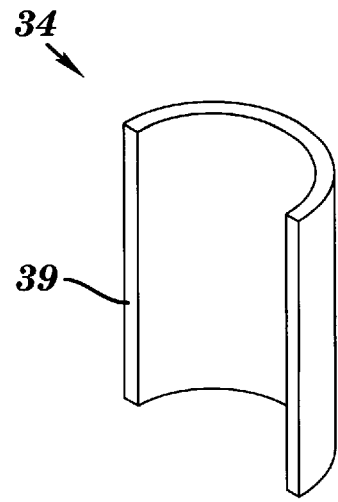
FIG. 8 depicts an isometric view of a plated through hole formed by pre-profiling in accordance with the present invention.

FIG. 8 shows pre-profiled plated through hole 34 having pre-profiled surface 39 produced by cutting tool 28. FIG. 9 further illustrates pre-profiled plated through hole 34 in circuit board 20, having an adjacent hole 36 which is produced by the pre-profiling process.

Figure 10:
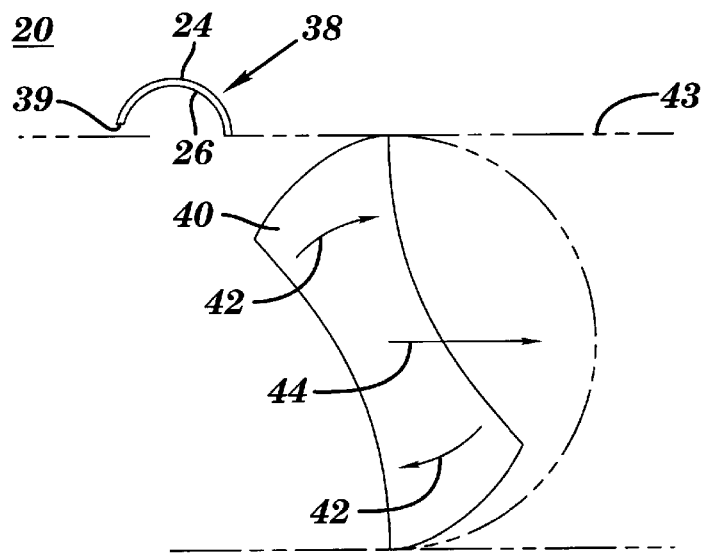
FIG. 10 depicts a castellated plated through hole produced following a subsequent profiling process in accordance with the present invention.
Figure 11:
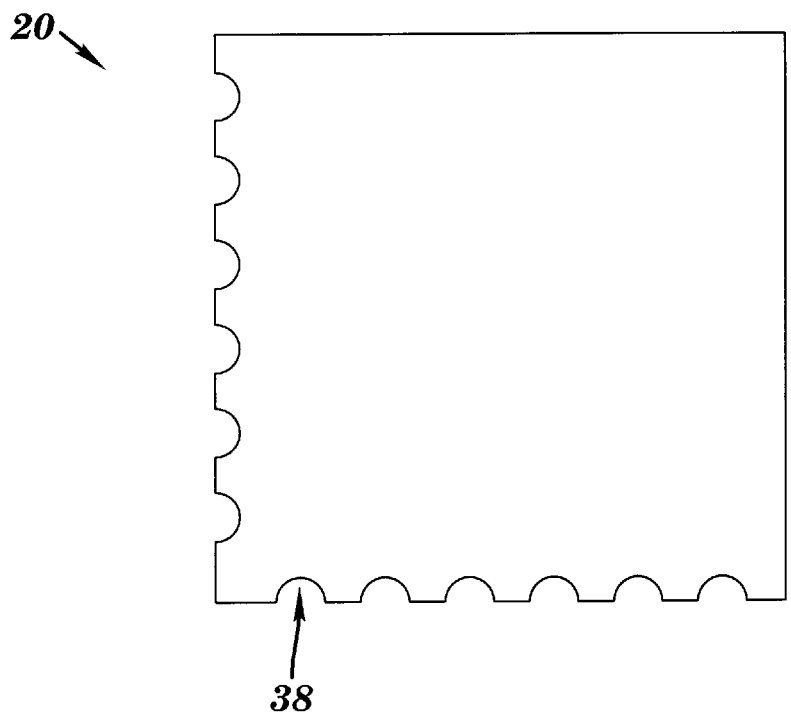
FIG. 11 depicts a portion of a circuit board having burr free castellated plated through holes in accordance with the present invention.

FIG. 10 shows castellated plated through hole 38 after profiling tool 40, such as a milling cutter, or other conventional tool, rotating in the direction indicated by arrows 42 and moving laterally in the direction of arrow 44 along path 43, removes a remaining unwanted portion of pre-profiled plated through hole 34 (refer to FIG. 9). A recessed portion or the castellated plated through hole 38 remains at the periphery of circuit board 20. Path 43 of the profiling operation should be at an off-set distance of about 0.001 to 0.003 inches from pre-profiled edge 39 to ensure conductive laminate 26 is not touched by profiling tool 40 as it passes or else a burr will form regardless of the pre-profiling step. FIG. 11 depicts circuit board 20 produced in accordance with the present invention having burr free castellated plated through holes 38, unlike the prior art.

Removal of a section of plated through hole 22 during the pre-profiling process, thereby creating pre-profiled edge 39, in conjunction with performing the subsequent profiling operation at an off-set distance from pre-profiled edge 39 effectively prevents the burr formation encountered by prior art methods. Specifically, the present invention prevents burr formation by removing the leading edge, via machining, (illustrated in FIG. 3 as leading edge 8) which is typically hit during profiling, and creating pre-profiled edge 39. Since pre-profiled edge 39 is slightly off-set from path 43 of profiling tool 40, pre-profiled edge 39 is not contacted by profiling tool 40 as it passes. Accordingly, conductive laminate 26 is not pulled away from inner hole wall 24 of plated through hole 22 during profiling, as with prior art methods, thereby preventing burr formation.

It should be noted that both pre-profiling and subsequent profiling steps may be performed using the same tool if necessary or desirable.

It should also be appreciated that cutting tool 28 may be applied to either side of circuit board 20 during the pre-profiling process.

As an alternative to pre-profiling plated through hole 22 using cutting tool 28, followed by a subsequent profiling process using profiling tool 40, the entire removal process may be performed by a process known as "nibbling." Nibbling is the use of a drilling tool, milling tool, or other appropriate tool, which first plunges all the way through circuit board 20, removing a lengthwise portion of plated through hole 22. Subsequent plunges through the thickness of circuit board 20 are performed to remove the remaining unwanted portions of plated through hole 22, rather than using profiling tool 40. Accordingly, castellated plated through hole 38 having the normal roughness associated with a nibbling process is produced.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. A method of producing a circuit board having burr free castellated plated through holes, comprising the steps of:
   providing the circuit board having at least one plate through hole therein;
   removing a lengthwise portion of the at least one plated through hole; and
   profiling the at least one plated through hole, leaving a recessed portion at an edge of the circuit board.

2. The method of claim 1, wherein the steps of removing the lengthwise portion of the at least one plated through hole and profiling the at least one plated through hole are performed using the same tool.

3. The method of claim 1, wherein the step of profiling the at least one plated through hole is performed at an off-set distance from an edge created by removing the lengthwise portion of the at least one plated through hole to prevent burr formation.

4. A method of producing a burr free castellated plated through hole, comprising the steps of:
   providing a circuit board having at least one plated through hole therein;
   removing a lengthwise section of a vertical wall of the at least one plated through hole; and
   removing a portion of the at least one plated through hole, leaving a recessed portion within an edge of the circuit board.

5. The method of claim 4, wherein the steps of removing the lengthwise section of a vertical wall of the at least one plated through hole and removing the portion of the at least one plated through hole are performed using the same tool.

6. The method of claim 4, wherein the step of removing the portion of the at least one plated through hole is performed at an off-set distance from an edge created by removing the lengthwise section of the vertical wall of the at least one plated through hole to prevent burr formation.

7. The method of claim 4, wherein the step of removing the lengthwise section of a vertical wall of the at least one plated through hole is performed on a first side of the circuit board, and the step of removing the portion of the at least one plated through hole is performed on a second side of the circuit board.

8. The method of claim 4, wherein the step of removing the portion of the at least one plated through hole is accomplished by nibbling or a series of plunges.

* * * * *